United States Patent [19]

Morley et al.

[11] 4,330,930

[45] May 25, 1982

[54] ELECTRICALLY ALTERABLE READ ONLY MEMORY SEMICONDUCTOR DEVICE MADE BY LOW PRESSURE CHEMICAL VAPOR DEPOSITION PROCESS

[75] Inventors: Richard M. Morley, Yonkers; Jagir S. Multani; J. S. Sandhu, both of Dix Hills, all of N.Y.

[73] Assignee: General Instrument Corp., Hicksville, N.Y.

[21] Appl. No.: 120,741

[22] Filed: Feb. 12, 1980

[51] Int. Cl.³ ............................................. H01L 21/18
[52] U.S. Cl. .................................. 29/571; 29/576 R; 427/94
[58] Field of Search ............. 29/571, 576 R; 148/187, 148/175; 427/94

[56] References Cited

U.S. PATENT DOCUMENTS

| | | | |
|---|---|---|---|
| 3,485,666 | 12/1969 | Sterling et al. | 427/39 |
| 3,520,722 | 7/1970 | Scott | 148/187 |
| 3,540,926 | 11/1970 | Rairden | 427/42 |
| 4,011,576 | 3/1977 | Uchida | 357/23 |
| 4,140,548 | 2/1979 | Zimmer | 148/187 |
| 4,198,252 | 4/1980 | Hsu | 148/187 |

FOREIGN PATENT DOCUMENTS 1545880 5/1979 United Kingdom .

OTHER PUBLICATIONS

Rosler, *Solid State Technology*, Apr. 1977, pp. 63–69.
DeLong, "Advances in Dichlorosilane Epitaxial Technology", *Solid State Technology*, Oct. 1972, pp. 29–41.

*Primary Examiner*—G. Ozaki
*Attorney, Agent, or Firm*—Darby & Darby

[57] ABSTRACT

An electrically alterable read only memory (EAROM) having a tunneling layer of an insulating material such as silicon dioxide which is grown on the substrate by thermal oxidation carried out at low pressure and a layer of silicon nitride laid down on the tunneling layer by a low-pressure chemical vapor deposition, the interface of the two layers forming a charge storage area with the EAROM having improved read/write switching capability and quality, and improved reliability and memory retentivity characteristics.

11 Claims, 9 Drawing Figures

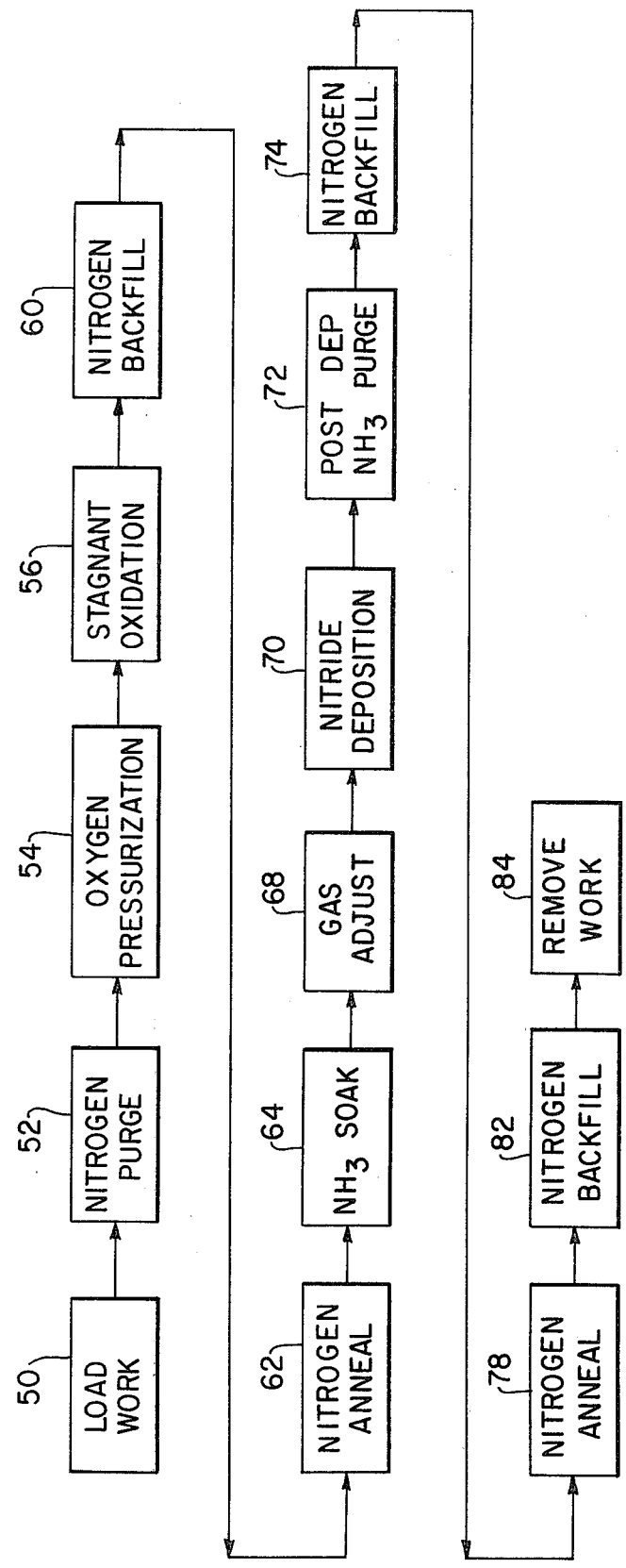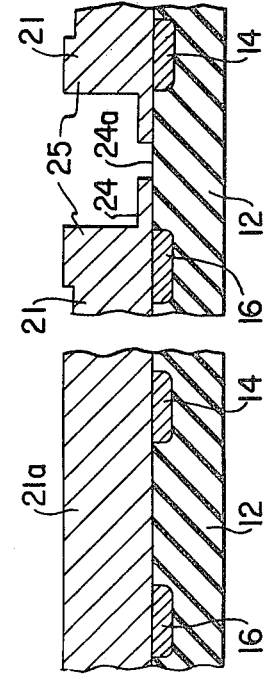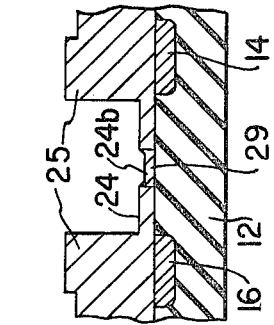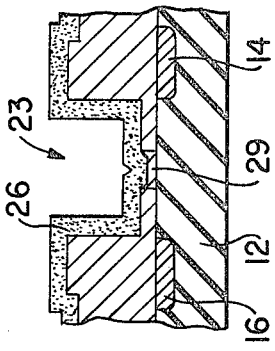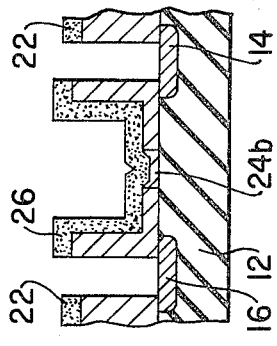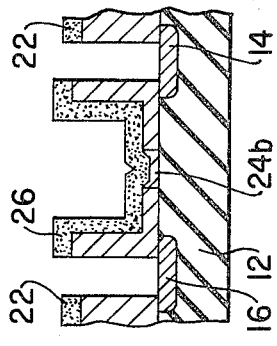

ELECTRICALLY ALTERABLE READ ONLY MEMORY SEMICONDUCTOR DEVICE MADE BY LOW PRESSURE CHEMICAL VAPOR DEPOSITION PROCESS

BACKGROUND OF THE INVENTION

Electrically alterable read only memory (EAROM) semiconductors are used as programmable non-volatile memory devices. Such memory devices in the form of individual memory cells can be laid down as part of an integrated circuit chip (IC) in predetermined patterns with high density at a relatively low cost. Such devices require low power and are relatively simple to erase and write by applying appropriate voltages to the gate electrode of the device. They have found widespread use in a variety of devices, for example, radio and television tuners, program storage circuits, etc.

BRIEF SUMMARY OF THE INVENTION

The present invention relates to an EAROM and, more particularly, to an improved EAROM of the metal-nitride-oxide semiconductor (MNOS) type. The EAROM has improved quality and reliability and also has improved operating characteristics such as the ability to be switched through an erase/write cycle for a greater number of times than prior EAROM devices and also, has a large time period of memory retentivity.

According to the invention, an EAROM device is provided which is made by a novel method. The method includes growing the tunneling, or gate, layer of insulating material, such as silicon dioxide, on the substrate (e.g., by a thermal oxidation reaction carried out at low pressure) and thereafter depositing a layer of charge storage material, such as silicon nitride, by low pressure chemical vapor deposition (LPCVD) rather than by a chemical vapor deposition process which is carried out at atmospheric pressure.

The memory retentivity characteristics of EAROM formed in this manner, with the tunneling layer of insulating material grown by thermal oxidation of the material with the substrate material, can be controlled. The reliability of the device is also improved by laying down of the charge storage layer by low pressure chemical vapor deposition.

OBJECTS

It therefore is an object of the present invention to provide an improved EAROM and a method of manufacturing the same.

An additional object is to provide an EAROM in which the insulating layer, or gate, is grown by a thermal oxidation reaction at low pressure.

A further object is to provide an improved EAROM in which the layer of charge storage material is laid down by a low pressure chemical vapor deposition technique.

A further object of the invention is to provide an EAROM having a silicon dioxide-silicon nitride interface, with the silicon dioxide layer being grown by a thermal reaction with the silicon substrate at low pressure and the silicon nitride layer deposited by a low pressure chemical vapor deposition.

These and other objects and advantages of the present invention will become more apparent upon reference to the following specification and annexed drawings, in which:

DESCRIPTION OF DRAWINGS

FIG. 3 is a flow diagram showing the process of manufacturing the device;

FIGS. 5A-E show the EAROM at various stages of the manufacturing process.

DETAILED DESCRIPTION

Figure 1:
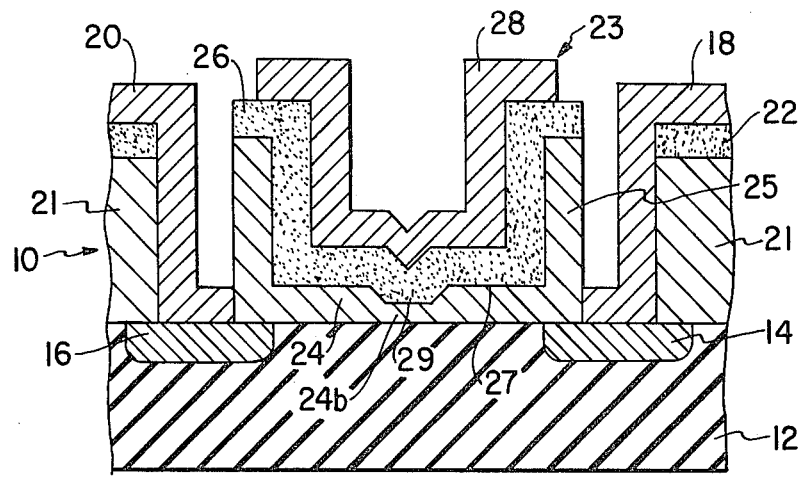
FIG. 1 is an elevational view in cross-section of a completed EAROM made in accordance with the invention.

Referring to FIG. 1, a typical completed EAROM memory cell 10 made in accordance with the invention is shown. The EAROM shown is of the PMNOS enhancement mode type although an NMNOS enhancement device also can be made. It includes a substrate 12, of a suitable material, for example, silicon, which has been suitably doped with an N-type impurity, for example, phosphorus. The impurity level can be, for example, in the order of approximately $2 \times 10^{15}$ atoms/cm. A pair of diffusion regions, or zones, 14,16 are formed on the top surface of the substrate to provide the source 14 which is doped with P type impurity and the drain 16 which is also doped with P type impurity. The procedures for forming these various diffusion zones are well known in the art and any conventional process can be used. The source and drain diffusions can be, for example, ion implanted boron having an impurity level in the order of $10^{20}$ atoms/cm$^3$.

It should be understood that only one memory cell is being described. A number of such cells are generally formed on the substrate at the same time, as is conventional in semiconductor manufacture.

The memory area is located between the source and drain diffusion regions. It is protected on each side by a field oxide barrier layer 21, for example, of silicon dioxide.

A memory cell 23 is formed on the substrate in the area between the barrier layers 21. The cell includes a layer 24 of suitable insulating material, such as silicon dioxide (SiO$_2$), on the substrate. For purposes of illustration, layer 24 is shown with upstanding vertical walls 25 forming a channel-shaped structure although these walls are not as pronounced in the actual structure. Layer 24 has a tunneling, or gate, portion 24b through which charges are to tunnel. As described below, the tunneling gate portion 24b is grown by a thermal chemical oxidation reaction with the substrate 12. On top of the SiO$_2$ layer 24 is deposited a charge storage layer 26 of an insulating material such as silicon nitride. As also described below, the charge storage layer 26 is deposited by low-pressure chemical vapor deposition. A charge storage area is formed at the interface of layers 24b and 26 as well as for a critical distance into the nitride layer.

Electrodes 18 and 20 are shown connected to the source and drain diffusion regions 14 and 16. These electrodes extend over the field oxide layers 21 and a layer of silicon nitride 22 is also preferably interposed between the two. A gate electrode 28 is connected to the nitride layer 26 to control the switching of the device. The electrodes 18, 20 and 28 can be of any suitable material, for example, aluminum. Operating voltages are applied to the device by these electrodes.

The thinner part in the middle of the SiO$_2$ layer 24 is formed with a channel 29 in which the tunneling gate portion 24b is located. The silicon nitride layer 26 overlies gate 24b in channel 29. The thinner SiO$_2$ thickness region is the memory gate region. In a typical device it has a thickness of about 20 A°, although the range can be from about 10 A° to about 35 A°. The remaining region of the interface is a non-memory region and has a thickness of about 400–500 A°, this thickness being selected to control the switching characteristics of the cell.

In the operation of the EAROM in FIG. 1, consider that drain and source 14,16 are at ground potential. If a voltage of the proper magnitude and polarity is applied to the gate electrode 28, charges of the opposite polarity will be attracted from the substrate. For example, consider that a negative voltage is applied to the gate electrode 28. The negative voltage causes positive charge carriers (holes) from the substrate 12 to tunnel through the silicon dioxide tunneling layer 24 and be trapped at the silicon dioxide-silicon nitride interface 27 in the gate area 24b. Since both silicon dioxide and silicon nitride are extremely high quality insulators, the charge will remain trapped for an extremely long period of time.

The EAROM is "written" into the low conduction state (or turned "off") by the application of a negative voltage to the gate electrode 28. This produces a net positive charge at the interface region. This charge has the same effect as a positive gate bias. It would oppose the field produced by normal logic level negative signals applied to the gate electrode.

The device is erased into a low threshold, or high conduction, state by the application of a positive voltage to the gate electrode 28. This positive voltage attracts electrons to the interface 27 producing a negative charge. This negative bias aids negative logic signals applied to the gate. In the erased state, the threshold may be so low that the device will always be "on". The low threshold erase state is determined by the thickness of the non-memory, or greater thickness, portion of the layer 24. That is, the thicker it is, the greater will be the magnitude of negative voltage applied to gate electrode 28 needed to turn the device "on". A typical low threshold voltage is about −2 volts. The "off" (write) low conduction state voltage can be in the order of about −12 volts. The fairly large difference between the "on" and "off" threshold voltage permits reliable address decoding.

In determining the reliability and applicability of an EAROM device, two characteristics are often referred to. The first of these is the efficiency, or switching time, of the write/erase cycle and the second is the duration of memory retentivity. As the thickness of the silicon dioxide layer is decreased in the memory gate region, the switching time is decreased by decreasing the distance of the charge injection path. This, however, decreases data retention time (retentivity) by allowing easier charge dissipation through the silicon dioxide. The retentivity time of a typical EAROM is typically given in years, with ten years being a not uncommon number. Increasing the density of the positive charge carriers trapped at the interface 27 also allows faster writing and erasing, but creates dispersion paths through the nitride layer thereby decreasing the data retention time.

Another characteristic to be considered is the number of write/erase switching cycles that the device can tolerate before breaking down. The number of such cycles is preferably made as great as possible. Any imperfections in the quality of the layers 24b, 26, for example, non-uniform thicknesses, impurities, etc., will decrease the number of write/erase cycles through which the device can be driven. Also, there is a preferential tunneling effect whereby the silicon dioxide layer experiences a greater debilitating effect during an erase cycle than a write cycle. Non-uniformity in the layer further increases the debilitating effect.

In a conventional EAROM manufacturing process, the nitride layer 26 is laid down by flowing gas at high pressure, usually at atmospheric pressure or slightly higher, into a vertical furnace. This process introduces some non-uniformity in the deposition of the nitride layer resulting in a lower yield and also some marginality in memory characteristics.

Figure 2:
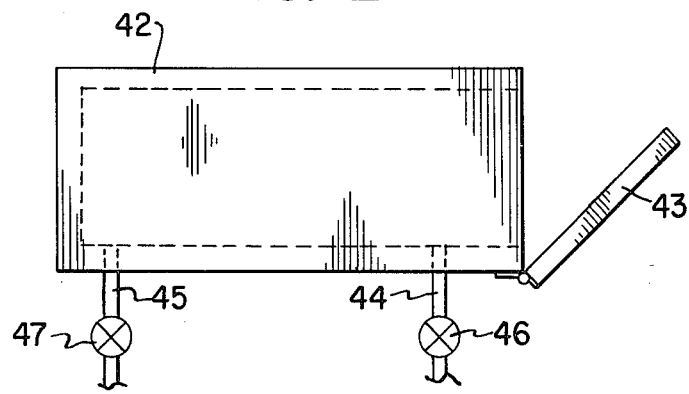
FIG. 2 is a schematic diagram of a furnace in which the EAROMs are processed.

FIG. 2 shows an apparatus and FIG. 3 a process for making the improved EAROM, while FIGS. 5A to 5E show the EAROM at various stages of the process. In FIG. 2, a horizontal furnace 40 is shown. The furnace, which can be a quartz tube 42 around which heating coils, such resistance heating coils (not shown) are wound, has a loading gate 43 with one or more inlets 44 into which various gases can be introduced and one or more outlets 45 which can be opened and closed by means of valves 46,47. The outlet 45 goes to a mechanical pump (not shown) of any suitable configuration. The devices of the invention can be made in a horizontal furnace such as 42 which requires a smaller capital investment than a vertical furnace and also permits more silicon blanks to be processed at the same time with greater reproducibility and uniformity.

A number of pre-processed silicon wafers are loaded into the furnace. As shown in FIG. 5A, these wafers have first been pre-processed to a point wherein the source and drain diffusion regions 14, 16 have been completed and a silicon dioxide field layer 21a grown. Further pre-processing, as shown in FIG. 5B includes etching layer 21a to form the field oxide barrier regions 21 and the vertical walls 25 for the memory cell region. As seen, a gap 24a is left to form the memory channel region. The processing steps to this point in forming the blanks is conventional.

The wafers of FIG. 5B are loaded into the furnace. They are preferably stacked vertically with spacing therebetween to permit the gas to flow and the reaction to take place.

The processing steps are carried out as described with respect to the flow diagram of FIG. 3. After the wafers are loaded in step 50, furnace tube 42 is first purged with an inert gas, such as nitrogen, in step 52 and is then evacuated.

The next step 54 is to pressurize the furnace tube with oxygen and then in step 56 to flow oxygen at a relatively low pressure through the furnace so that a thermal reaction, by thermal decomposition, is produced with the substrate 12 thereby forming the silicon dioxide layer on the memory gate region 29 of the substrate. The thermal oxidation is carried out at subatmospheric pressure, for example, at a pressure in the range of from about 2 mm of Hg to about 500 mm of Hg and at a temperature from between about 625° C. to about 750° C.

FIG. 5C shows the device at the stage of the process wherein the memory gate tunneling layer 24b has been grown. As seen, the memory gate tunneling layer 24b is grown in the gap 24a (FIG. 5B) and is of lesser thickness than the remainder of layer 24. The function of the thicker portion of layer 24 was described previously.

Figure 4:
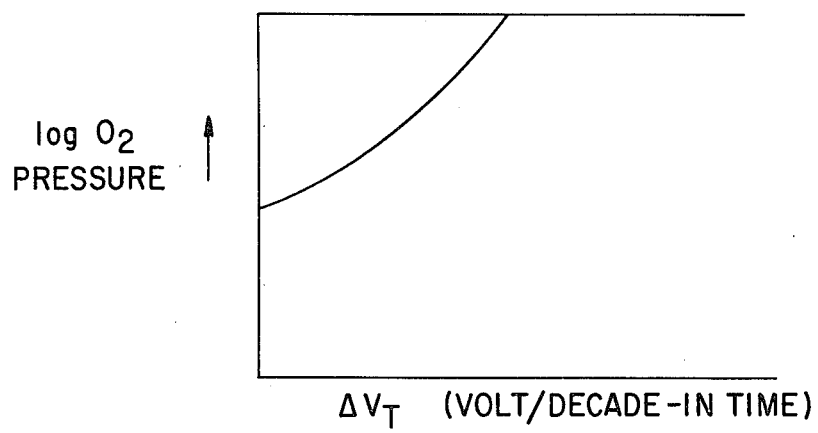
FIG. 4 is a graph showing the relationship between retentivity and the pressure at which the silicon dioxide layer is grown.

In the prior art method for making EAROM's, the silicon dioxide memory gate layer 24b is also grown by thermal reaction of oxygen with the silicon substrate but at atmospheric pressure. It has been found that the memory retentivity characteristics of an EAROM is directly related to the pressure at which the memory gate layer 24b is deposited. A graph of this relationship is shown in FIG. 4 where it is seen that the retentivity property given in terms of $\Delta V_T$ (change of electrically alterable threshold voltage) in volts/decade increases with lower pressures. Thus, to increase $\Delta V_T$, the oxidation reaction is carried out at a lower pressure.

Thus, by controlling the pressure of the oxidation reaction, an EAROM is produced whose retentivity characteristics can be controlled and improved. It is believed that this feature has not heretofore been recognized.

In addition, the formation of the memory gate layer 24b is carried out at a much slower rate, since the pressure is lower, than would normally be carried out when the pressure is approaching atmospheric pressure. It appears that the oxidation at lower pressure allows a more complete reaction, meaning that the silicon dioxide layer is more uniform. This results in a device with better reliability.

After the oxidation reaction is concluded, the furnace tube is evacuated and there is a nitrogen back fill 60 to flush the tube. A nitrogen annealing step takes place at 62 in which the charge density at the $Si/SiO_2$ interface due to oxidation is minimized. The nitrogen annealing is carried out at a temperature of about 700° C.

After the nitrogen annealing is completed, the furnace tube is again evacuated, leak checks are performed and the furnace tube again evacuated. In step 64 ammonia ($NH_3$) is flowed into the furnace at a low rate and pressure before introducing the other gas, such as, for example, dichlorosilane ($SiH_2Cl_2$). The wafers soak in the ammonia gas for a predetermined time. The flow of $NH_3$ and dichlorosilane gases is adjusted at 68 and the nitride deposition is carried out at step 70 until the desired thickness of the nitride layer 26 is achieved.

The silicon nitride layer 26 is laid down by chemical vapor deposition. That is, there is a reaction of dichlorosilane with the ammonia to produce silicon nitride. This is carried out at low pressure. For example, a typical operating range would be from about 50 um Hg to about 50 mm Hg. The temperature of the furnace during the nitride deposition is in the range of from about 625° C. to about 750° C., with 700° C. being typical. The ratio of ammonia to silane in the range of about 50/1. The thickness of the silicon nitride layer is about 500 °A to about 600 °A.

The nitride deposition is carried out at a lower temperature than usually used in the prior art, this generally being about 800° C. It has been determined that there is a fairly linear relationship in the change of retentivity properties ($\Delta V_T$ as measured in volts/decade) as a function of the temperature at which the nitride layer is deposited. The higher the temperature, the greater will be $\Delta V_T$.

FIG. 5D shows the device after the deposition of the silicon nitride layer 26. As can be seen layer 26 overlies the field barrier regions 21 as well as filling in the gap between the top of the memory gate layer 24b and the upper surface of the layer 24.

After a sufficient time has passed to achieve the desired thickness for nitride layer 26, the flow of the silane gas is turned off and there is a post-deposition purge 72 with ammonia. The post-deposition purge ensures that the reaction with dichlorosilane is complete so that the nitride layer is completely laid down.

The furnace tube is again evacuated and a further nitrogen backfill is admitted at 74 into the tube. The tube is then subjected to a nitrogen annealing action at 78 again for the purpose of flushing any components of the chemical reaction and annealing out $O_{ss}$. The furnace is then evacuated and a nitrogen backfill takes place at 82. The work is then removed at 84. This completes the portion of the process carried out in the furnace.

The wafers are then etched again to form openings to the source and drain regions 14, 16. This is shown in FIG. 5E. The electrodes are then attached to give the completed device, shown in FIG. 1.

As seen, a novel EAROM device and method of manufacture has been disclosed. By carrying out certain steps in the process of laying down the layers of insulating material which form the memory cell, certain of the operating characteristics of the device can be controlled and the overall quality of the device improved.

What is claimed is:

1. A process of forming an electrically alterable read only memory semiconductor device comprising the steps of forming first and second spaced apart regions of a second conductivity type in a substrate of a first conductivity type, growing a layer of a first insulating material on said substrate in the space between said first and second regions, and depositing by chemical vapor deposition at a pressure substantially lower than atmospheric pressure a layer of a second insulating material of a higher dielectric constant than said first material on said first layer.

2. A process as in claim 1 wherein said first layer is grown by thermally reacting a gas with said substrate.

3. A process as in claim 2 wherein a gas is reacted with the substrate at a pressure substantially less than atmospheric to grow the first layer on the substrate.

4. A process as in claim 3 wherein the substrate is silicon and to form the first layer the gas is oxygen, the reaction is carried out at a pressure in the range of from about 2 mm Hg to about 500 mm Hg at a temperature in the range of from about 625° C. to about 750° C., to form said first layer as silicon dioxide.

5. A process as in claim 4 wherein said second layer is deposited by flowing a gas containing the reactants for the material of the second layer over the substrate having the first layer thereon at a pressure in the range of from about 50 um Hg to about 50 mm Hg.

6. A process as in claim 5 wherein the gas to form the second layer is dichlorosilane and ammonia to form said second layer as silicon nitride.

7. A process as in claim 1 wherein said second layer is deposited by flowing a gas containing the reactants for the material of the second layer over the substrate having the first layer thereon at a pressure in the range of from about 50 um Hg to about 50 mm Hg.

8. A process as in claim 7 wherein the gas is flowed at a pressure of about 30 mm Hg.

9. A process as in claim 7 wherein the gas is flowed at a temperature in the range of from about 625° C. to about 750° C.

10. A process as in claim 7 wherein the gas is dichlorosilane and ammonia to form said second layer as silicon nitride.

11. A process of forming an electrically alterable read only memory semiconductor device comprising the steps of forming first and second spaced apart regions of a second conductivity type in a substrate of silicon of a first conductivity type, growing a layer of silicon dioxide insulating material on said substrate in the space between said first and second regions by flowing oxygen over said substrate at a pressure in the range of from about 2 mm Hg to about 500 mm Hg, and depositing on said first layer a layer of a first insulating material of a higher dielectric constant than said silicon dioxide layer.

* * * * *